United States Patent
Jin et al.

(10) Patent No.: US 7,863,672 B2
(45) Date of Patent: Jan. 4, 2011

(54) NON-VOLATILE MEMORY DEVICE AND METHOD OF FABRICATING THE SAME

(75) Inventors: Young-gu Jin, Suwon-si (KR);
Yoon-dong Park, Yongin-si (KR);
Won-joo Kim, Hwaseong-si (KR);
Suk-pil Kim, Yongin-si (KR);
Seung-hoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/285,403

(22) Filed: Oct. 3, 2008

(65) Prior Publication Data

US 2009/0184360 A1     Jul. 23, 2009

(30) Foreign Application Priority Data

Jan. 18, 2008     (KR) .................... 10-2008-0005852

(51) Int. Cl.
*H01L 29/788* (2006.01)
*H01L 29/792* (2006.01)
*H01L 21/336* (2006.01)

(52) U.S. Cl. .................. 257/319; 257/324; 257/E29.3; 257/E29.309; 257/E21.409; 257/E21.18; 438/264; 438/129; 438/586

(58) Field of Classification Search .................. 257/24, 257/319, 324, E29.3, E29.309, E21.409, 257/E21.691, E21.18; 438/264, 129, 586
See application file for complete search history.

(56) References Cited

U.S. PATENT DOCUMENTS

2009/0180324 A1* 7/2009 Ramaswamy et al. .. 365/185.17

* cited by examiner

*Primary Examiner*—Sue Purvis
*Assistant Examiner*—Whitney Moore
(74) *Attorney, Agent, or Firm*—Harness, Dickey & Pierce, P.L.C.

(57) ABSTRACT

Provided are a non-volatile memory device that may expand to a stacked structure and may be more easily highly integrated and an economical method of fabricating the non-volatile memory device. The non-volatile memory device may include at least one semiconductor column. At least one first control gate electrode may be arranged on a first side of the at least one semiconductor column. At least one second control gate electrode may be arranged on a second side of the at least one semiconductor column. A first charge storage layer may be between the at least one first control gate electrode and the at least one semiconductor column. A second charge storage layer may be between the at least one second control gate electrode and the at least one semiconductor column.

25 Claims, 6 Drawing Sheets

NON-VOLATILE MEMORY DEVICE AND METHOD OF FABRICATING THE SAME

PRIORITY STATEMENT

This application claims priority under U.S.C. §119 to Korean Patent Application No. 10-2008-0005852, filed on Jan. 18, 2008, in the Korean Intellectual Property Office (KIPO), the entire contents of which are incorporated herein by reference.

BACKGROUND

1. Field

Example embodiments relates to a semiconductor device, and more particularly, to a non-volatile memory device that may store data using a charge storage layer and a method of fabricating the non-volatile memory device.

2. Description of the Related Art

Needs for semiconductor products with smaller volume and higher data processing capacity are increasing. To satisfy these needs, the operation speed and the degree of integration of non-volatile memory devices used in semiconductor products may be increased. In this respect, non-volatile memory devices with a multilayer structure, rather than a conventional monolayer structure, may be advantageous for increased integration.

Using the multilayer structure, memory cells may be vertically stacked in a region where a monolayer structure is formed. However, in such a non-volatile memory device with a multilayer structure, connecting memory cells in different layers and selecting memory cells from each layer is difficult. In addition, in the non-volatile memory device with a multilayer structure, as the number of stacked layers increases, the manufacturing cost becomes higher because more manufacturing processes may be required.

SUMMARY

Example embodiments provide a non-volatile memory device that may expand to a stacked structure and may be highly integrated. Example embodiments provide an economical method of fabricating the non-volatile memory device.

According to example embodiments, there is provided a non-volatile memory device including at least one semiconductor column. At least one first control gate electrode may be arranged on a first side of the at least one semiconductor column. At least one second control gate electrode may be arranged on a second side of the at least one semiconductor column. A first charge storage layer may be between the at least one first control gate electrode and the at least one semiconductor column. A second charge storage layer may be between the at least one second control gate electrode and the at least one semiconductor column.

The at least one first control gate electrode may include a plurality of first control gate electrodes stacked along the at least one semiconductor column, and the at least one second control gate electrode may include a plurality of second control gate electrodes stacked along the at least one semiconductor column. The at least one semiconductor column may include a plurality of semiconductor columns between the at least one first control gate electrode and the at least one second control gate electrode.

The first charge storage layer may extend across a first side of the plurality of semiconductor columns, and the second charge storage layer may extend across a second side of the plurality of semiconductor columns. The at least one semiconductor column may include a plurality of semiconductor columns, the at least one first control gate electrode may include a plurality of first control gate electrodes stacked along a first side of the plurality of semiconductor columns, and the at least one second control gate electrode may include a plurality of second control gate electrodes stacked along a second side of the plurality of semiconductor columns.

The non-volatile memory device may further include a plurality of first word lines stacked as multiple layers to be connected to the plurality of first control gate electrodes, and a plurality of second word lines stacked as multiple layers to be connected to the plurality of second control gate electrodes.

According to example embodiments, there is provided a method of fabricating a non-volatile memory device, the method including providing at least one conductive layer. At least one trench may be formed in the at least one conductive layer. A charge storage layer may be formed on an inner surface of the at least one trench. At least one semiconductor column may be formed in the at least one trench on which the charge storage layer is formed. The at least one conductive layer may be patterned to form at least one first control gate electrode and at least one second control gate electrode that are separated from one another with the at least one semiconductor column therebetween.

Forming the at least one semiconductor column may include forming a semiconductor layer on the charge storage layer to fill the at least one trench, and patterning the semiconductor layer to form a plurality of semiconductor columns separated from one another in the at least one trench.

The method of fabricating a non-volatile memory device may further include forming a blocking insulating layer on an inner surface of the at least one trench before forming the charge storage layer. The method also may further include forming a tunneling insulating layer on the charge storage layer after forming the charge storage layer.

BRIEF DESCRIPTION OF THE DRAWINGS

Example embodiments will be more clearly understood from the following detailed description taken in conjunction with the accompanying drawings.

FIG. 1 is a perspective view of a non-volatile memory device with a basic structure according to example embodiments;

FIG. 2 is a perspective view of a non-volatile memory device with a NAND structure according to example embodiments;

FIG. 3 is a perspective view of a non-volatile memory device with a stacked structure according to example embodiments;

FIG. 4 is a cross-sectional view of the non-volatile memory device taken along line IV-IV' in FIG. 3;

FIGS. 5-10 are perspective views for explaining a method of fabricating a non-volatile memory device according to example embodiments;

FIG. 11 is a block diagram of a card according to example embodiments; and

FIG. 12 is a block diagram of a system according to example embodiments.

Figure 1:
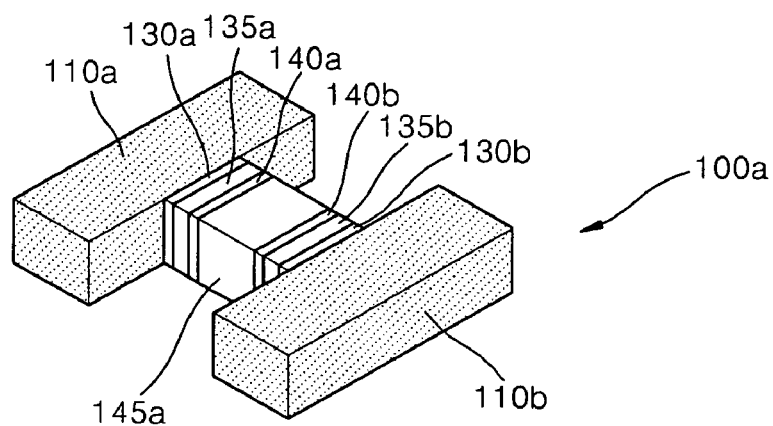
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail by explaining example embodiments with reference to the attached drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the sizes of elements are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, the expression "at least one" regarding the number of elements means that the element may be one or more. Thus, the expression "at least one" may be interchangeably used with "one or more" or "single or multiple". In example embodiments, the non-volatile memory device processes data using a charge storage layer. Examples of such a non-volatile memory device include, but are not limited to, an electrically erasable programmable read only memory (EEPROM) and a flash memory device.

FIG. 1 is a perspective view of a non-volatile memory device 100a with a basic structure according to example embodiments. Referring to FIG. 1, a semiconductor column 145a may define a channel region in a non-volatile memory device 100a. The semiconductor column 145a may contain a semiconductor material. For example, the semiconductor column 145a may contain silicon (Si), germanium (Ge) or Si—Ge, which may be commonly used. However, example embodiments may not be limited to these materials. These semiconductor materials may have a monocrystalline structure or a polycrystalline structure. The semiconductor column 145a may have different polygonal column shapes including a rectangular column shape and further may have a circular column shape.

The first control gate electrode 110a may be arranged on a first side of the semiconductor column 145a, and the second control gate electrode 110b may be arranged on a second side of the semiconductor column 145a. The first control gate electrode 110a and the second control gate electrode 110b may be symmetrically arranged with the semiconductor column 145a therebetween. For example, when the semiconductor column 145a is a rectangular column, the first control gate electrode 110a and the second control gate electrode 110b may be arranged on the opposing sides of the semiconductor column 145a. The first control gate electrode 110a and the second control gate electrode 100b may extend parallel to each other. However, example embodiments may not be limited to this arrangement, which is presented as an example. For example, the first control gate electrode 110a and the second control gate electrode 110b may not be parallel to each other as long as the first and second control gate electrodes 110a and 110b do not contact each other.

The first charge storage layer 135a may be interposed between the semiconductor column 145a and the first control gate electrode 110a, and the second charge storage layer 135b may be interposed between the semiconductor column 145a and the second control gate electrode 110b. For example, when the semiconductor column 145a is a rectangular column, the first charge storage layer 135a may be arranged so as to cover a surface of the semiconductor column 145a, and the second charge storage layer 135b may be arranged so as to cover another surface of the semiconductor column 145a that faces away from the surface covered with the first charge storage layer 135a.

For example, the first charge storage layer 135a and the second charge storage layer 135b may be a charge trapping type. In example embodiments, the first charge storage layer 135a and the second charge storage layer 135b may contain a nitride layer, quantum dots, or nanocrystals. Quantum dots or nanocrystals may include conductive microstructures formed of, for example, metal or polysilicon.

Furthermore, the first blocking insulating layer 130a may be interposed between the first control gate electrode 110a and the first charge storage layer 135a. The second blocking insulating layer 130b may be interposed between the second control gate electrode 110b and the second charge storage layer 135b. The first tunneling insulating layer 140a may be interposed between the first charge storage layer 135a and the semiconductor column 145a. The second tunneling insulating layer 140b may be interposed between the second charge storage layer 135b and the semiconductor column 145a. For example, the first and second blocking insulating layers 130a and 130b and the first and second tunneling insulating layers 140a and 140b may include a stacked structure of one or at least two layers selected from the group consisting of an oxide layer, a nitride layer, and a high-k dielectric layer.

In the non-volatile memory device 100a, the first and second control gate electrodes 110a and 110b may be used as part of a pair of word lines, and the semiconductor column 145a may be used as a part of bit lines. Thus, the non-volatile memory device 100a may represent a pair of memory cells sharing a bit line, e.g., the semiconductor column 145a.

A program operation of memory cells may be performed by supplying a program voltage to one selected from the first and second control gate electrodes 110a and 110b. Consequently, charges may be selectively injected from the semiconductor column 145a to one of the first and second charge storage layers 135 and 135b by tunneling. A read operation of memory cells may be performed by sequentially supplying a read voltage to the first and second control gate electrodes 110a and 110b. In example embodiments, changes in threshold voltage according to whether there are charges stored in the first and second charge storage layers 135a and 135b may be read. In addition, an erase operation of memory cells may be simultaneously performed in units of a block by supplying an erase voltage to the semiconductor column 145a.

Thus, even when the non-volatile memory device 100a uses a single level cell (SLC) operation mode, 2-bit data may be processed. In addition, when the non-volatile memory device 100a uses a multi-level cell (MLC) operation mode, more than 2-bit data may be processed. Thus, the non-volatile memory device 100a may be suitable for processing relatively large amounts of data.

Figure 2:
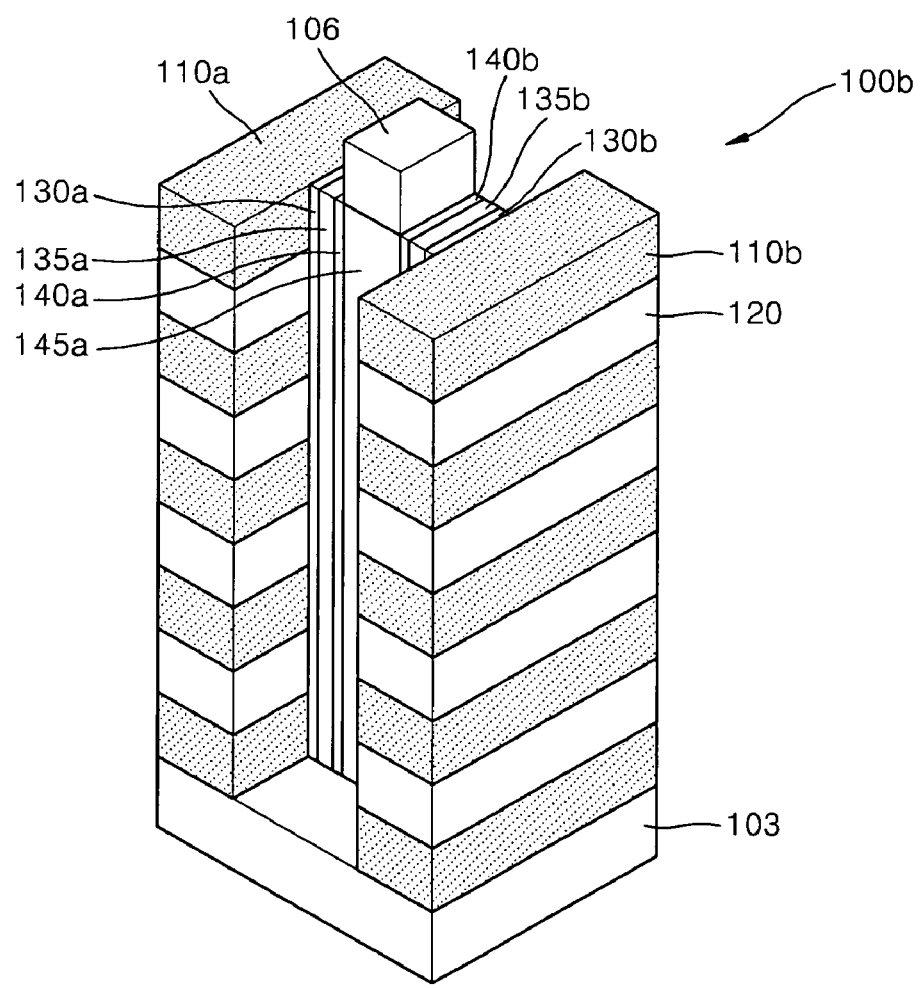

FIG. 2 is a perspective view of a non-volatile memory device 100b with a NAND structure according to example embodiments. Referring to FIG. 2, the non-volatile memory device 100b may be a stack of multiple non-volatile memory devices 100a in FIG. 1. The semiconductor column 145a may be vertically extending from a substrate 103. A plurality of first control gate electrodes 110a may be stacked along a first side of the semiconductor column 145a, and a plurality of second control gate electrodes 110b may be stacked along a second side of the semiconductor column 145a.

Interlayer insulating layers 120 may be interposed between the first control gate electrodes 110a and between the second control gate electrodes 110b. The numbers of first control gate electrodes 110a and second control gate electrodes 110b in FIG. 2 are illustrated as an example, and may be appropriately varied according to the memory capacity of the non-volatile memory device 100b.

The first blocking insulating layer 130a, the first charge storage layer 135a and the first tunneling insulating layer 140a may be interposed between the first control gate electrodes 110a and the semiconductor column 145a. For example, the first blocking insulating layer 130a, the first charge storage layer 135a and the first tunneling insulating layer 140a may extend across the first control gate electrodes 110a and along the semiconductor column 145a on the substrate 103.

The second blocking insulating layer 130b, the second charge storage layer 135b and the second tunneling insulating layer 140b may be interposed between the second control gate electrodes 110b and the semiconductor column 145a. For example, the second blocking insulating layer 130b, the second charge storage layer 135b and the second tunneling insulating layer 140b may extend across the second control gate electrodes 110b and along the semiconductor column 145a on the substrate 103.

A source/drain region 106 may be defined on an end portion of the semiconductor column 145a that faces away from the substrate 103. Each of the source/drain region 106 and the substrate 103 may form a PN junction with the semiconductor column 145a. For example, the substrate 103 may be used as part of a common source line, and the source/drain region 106 may be used as a contact region of a bit line. Although the source/drain region 106 is not formed in a portion of the semiconductor column 145a that faces the interlayer insulating layer 120, a source/drain may be electrically induced in that portion due to an electrical field effect by the fringing field of the first and second control gate electrodes 110a and 110b. Alternatively, the source/drain region of a PN junction type may be further formed in the portion of the semiconductor column 145a that faces the interlayer insulating layer 120.

The non-volatile memory device 100b may represent a pair of NAND strings vertically arranged on the substrate 103. Thus, when using the non-volatile memory device 100b, a pair of NAND strings may be arranged in an area where a pair of memory cells may be arranged in a conventional device. Thus, the non-volatile memory device 100b may be advantageous for increased integration.

Figure 3:
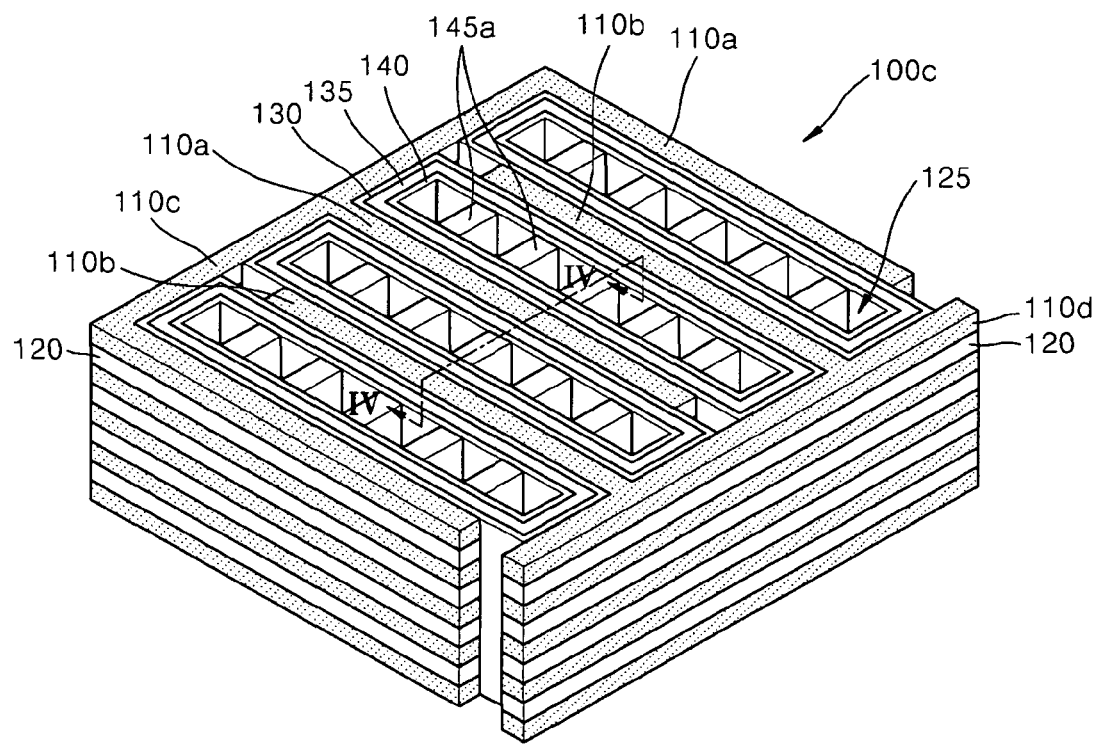
Figure 4:
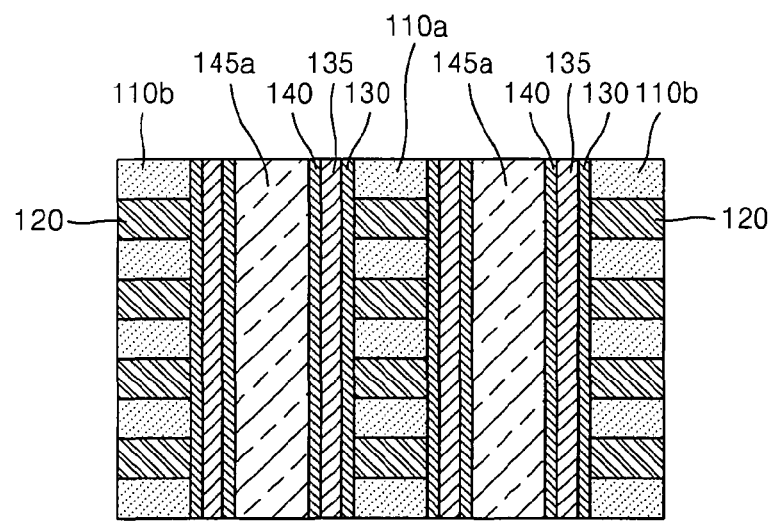

FIG. 3 is a perspective view of a non-volatile memory device 100c with a stacked structure according to example embodiments. FIG. 4 is a cross-sectional view of the non-volatile memory device 100c taken along line IV-IV' in FIG. 3. The non-volatile memory device 110c may have the array structure of the non-volatile memory device 100b of FIG. 2, which will not be described here to avoid repetition. Referring to FIGS. 3 and 4, a plurality of semiconductor columns 145a may be arranged as a matrix. The first control gate electrode 110a and the second control gate electrode 110b may be arranged as multiple layers with the semiconductor columns 145a therebetween. A plurality of first control gate electrodes 110a may be stacked as multiple layers along a first side of the semiconductor columns 145a, and a plurality of second control gate electrodes 110b may be stacked as multiple layers along a second side of the semiconductor columns 145a.

A plurality of charge storage layers 135 may be arranged to surround multiple columns of the semiconductor columns 145a in the matrix. For example, each of the charge storage layers 135 may correspond to a combination of at least one of the first charge storage layers 135a and at least one of the second charge storage layers 135b in FIG. 2. Thus, the charge storage layer 135 may extend across the first and second control gate electrodes 110a and 110b and along the semiconductor columns 145a.

A plurality of blocking insulating layers 130 may be arranged between the first control gate electrodes 110a and the charge storage layers 135 and between the second control gate electrodes 110 and the charge storage layers 135. For example, each of the blocking insulating layers 130 may correspond to a combination of at least one of the first blocking insulating layers 130a and at least one of the second blocking insulating layers 130b in FIG. 2. A plurality of tunneling insulating layers 140 may be interposed between the charge storage layers 135 and the semiconductor columns 145a. For example, each of the tunneling insulating layers 140 may correspond to a combination of at least one of the first tunneling insulating layers 140a and at least one of the second tunneling insulating layers 140b in FIG. 2.

A plurality of first word lines 110c may be arranged as multiple layers to be connected to the first control gate electrodes 110a. A plurality of second word lines 110d may be arranged as multiple layers to be connected to the second control gate electrodes 110b. For examples, the first word lines 110c and the second word lines 110d may be arranged on opposing sides of the non-volatile memory device 100c, separate from each other, with the semiconductor columns 145a therebetween. For example, the first word lines 110c may be connected to an end of the first control gate electrodes 110a, and the second word lines 110d may be connected to an end of the second control gate electrodes 110b that faces away from the end of the first control gate electrodes 110 to which the first word lines 110c are connected.

In the non-volatile memory device 100c, a single memory cell may be chosen by selecting one of the semiconductor columns 145a and one of the first and second word lines 110c and 110d. A plurality of trenches 125 may be formed in the stacked structure of the control gate electrodes and word lines 110a, 110b, 110c, and 110d and the interlayer insulating layers 120. For the operation of this selected memory cell, the above-description with reference to FIG. 1 may be referred to. The non-volatile memory device 110c may have a higher degree of integration when a vertical NAND structure is implemented using the stacked structure. Thus, the non-volatile memory device 110c may be suitable for products of processing large amounts of data.

Figure 5:
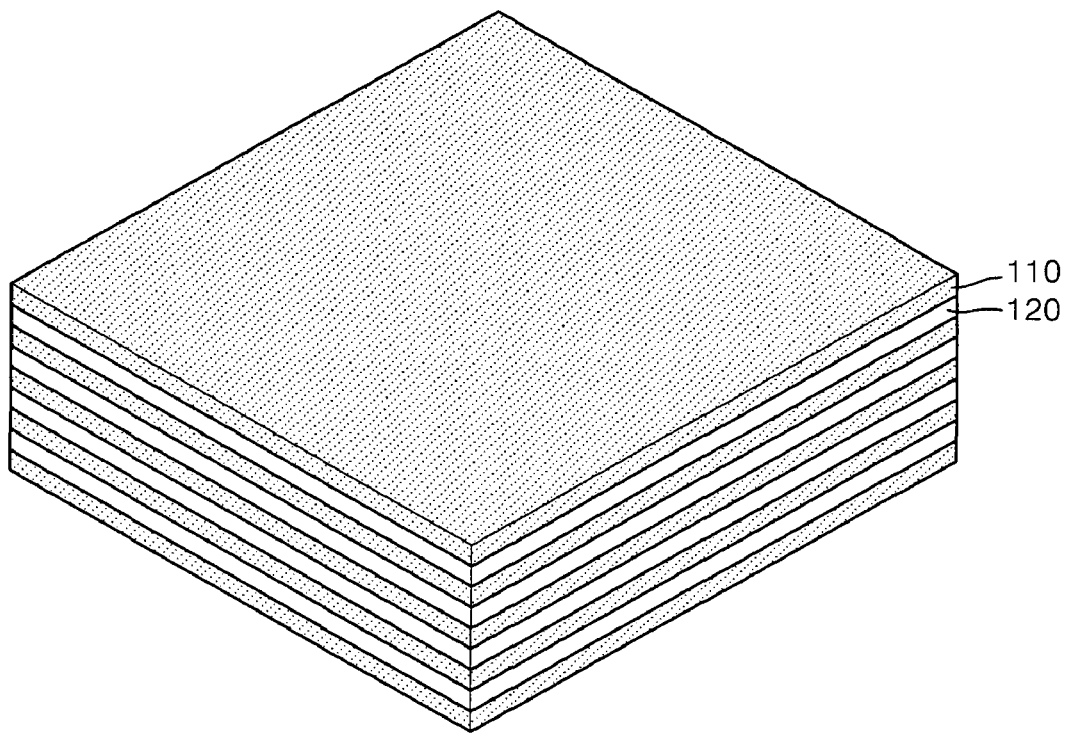

FIGS. 5 through 10 are perspective views for explaining a method of fabricating a non-volatile memory device 100c according to example embodiments. Referring to FIG. 5, at least one of, for example, a plurality of conductive layers 110, and at least one of, for example, a plurality of interlayer insulating layers 120, may be alternately stacked. For examples, the conductive layers 110 may include a stacked structure of one or at least two layers selected from a polysilicon layer, a metal layer and a metal silicide layer. The interlayer insulating layers 120 may include a stacked structure of one or at least two layers selected from the group consisting of an oxide layer, a nitride layer, and a low-k dielectric layer.

Figure 6:
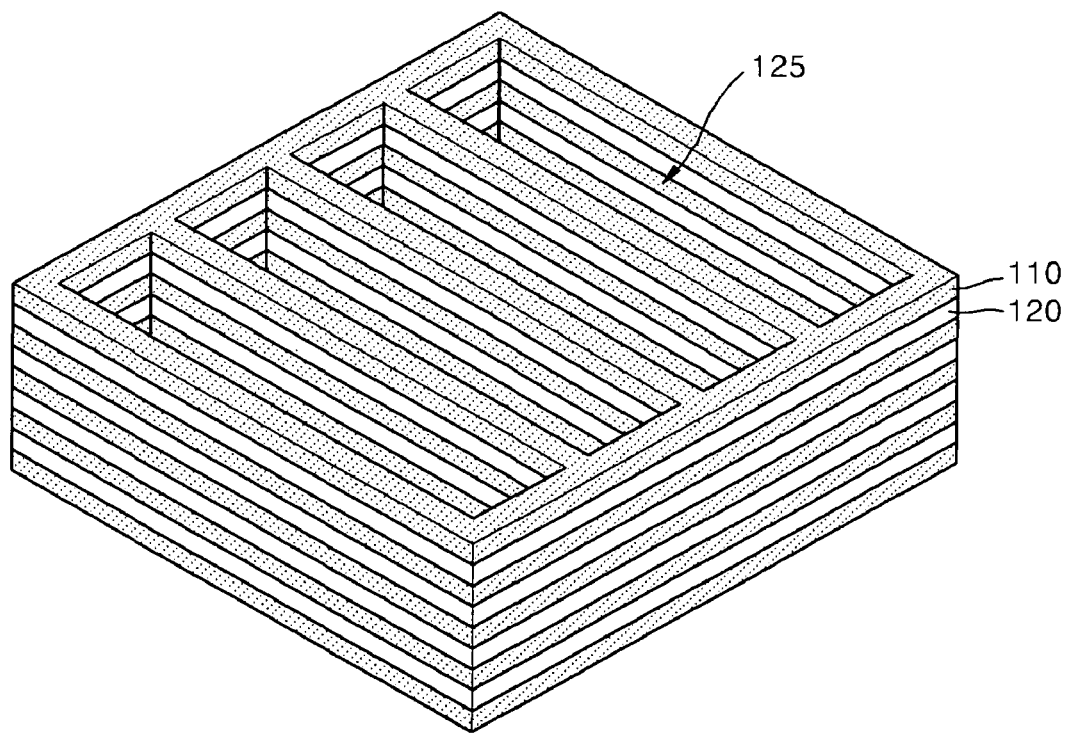

Referring to FIG. 6, a plurality of trenches 125 may be formed in the stacked structure of the conductive layers 110 and the interlayer insulating layers 120. For examples, the trenches 125 may be formed using photolithography and etching technology. The conductive layers 110 remaining after the trenches 125 have been formed may define the basic dimensions of the first and second control gate electrodes 110a and 110b (refer to FIG. 10) and the first and second word lines 110c and 110d (refer to FIG. 10). Thus, the width and length of the trenches 125 may be appropriately varied according to the memory capacity of the non-volatile memory device.

Figure 7:
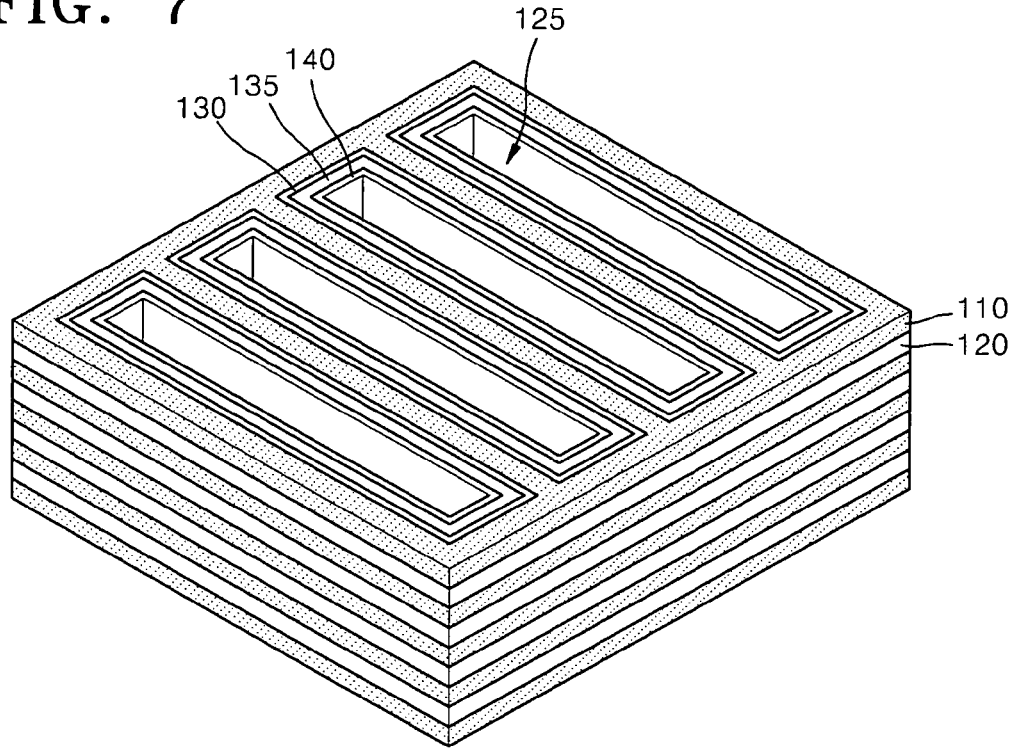

Referring to FIG. 7, blocking insulating layers 130, charge storage layers 135 and tunneling insulating layers 140 may be sequentially formed on the inner surface of the trenches 125. For example, once the blocking insulating layers 130 are formed, the charge storage layers 135 may be formed on the blocking insulating layers 130. The tunneling insulating layers 140 may be formed on the charge storage layers 135. The blocking insulating layers 130, the charge storage layers 135 and the tunneling insulating layers 140 may be formed using chemical vapor deposition (CVD).

Figure 8:
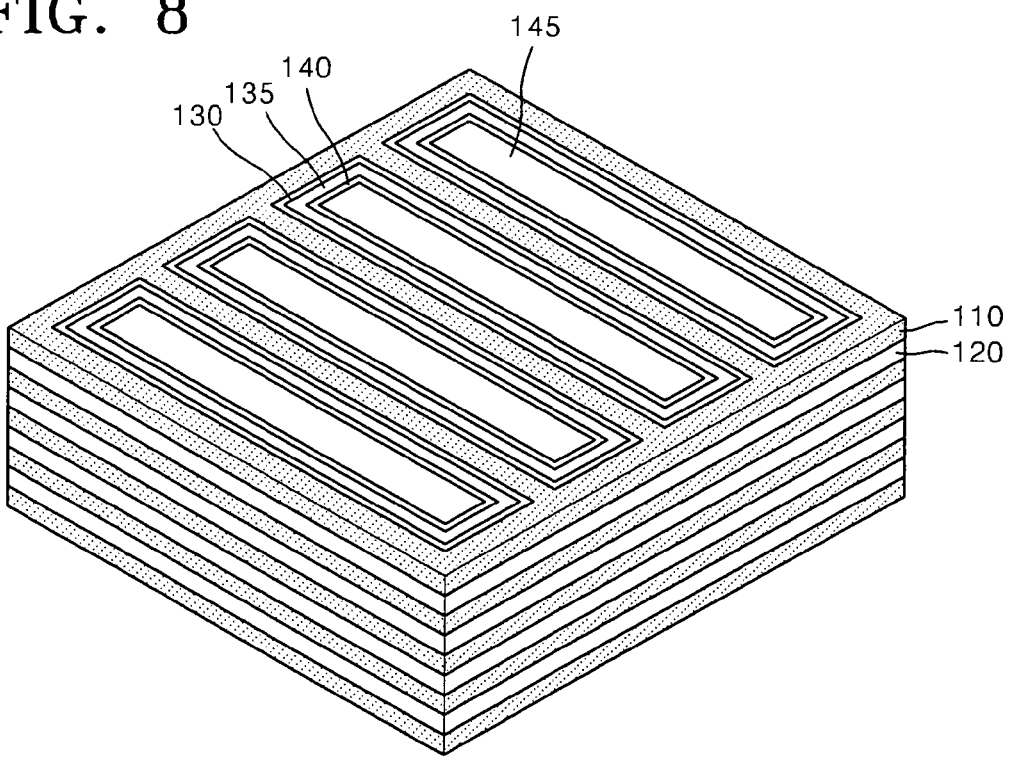

Referring to FIG. 8, semiconductor layers 145 may be formed on the tunneling insulating layers 140 to fill the trenches 125. For example, the semiconductor layers 145 may be formed using CVD and planarized. This planarization may be performed using etch back or chemical mechanical planarization (CMP). For example, the semiconductor layers 145 may be directly formed of polysilicon. Alternatively, the semiconductor layers 145 may be formed of amorphous silicon and crystallized. In another example, the semiconductor layers 145 may be grown on the substrate 103 (refer to FIG. 2) to be monocrystalline epitaxial layers.

Figure 9:
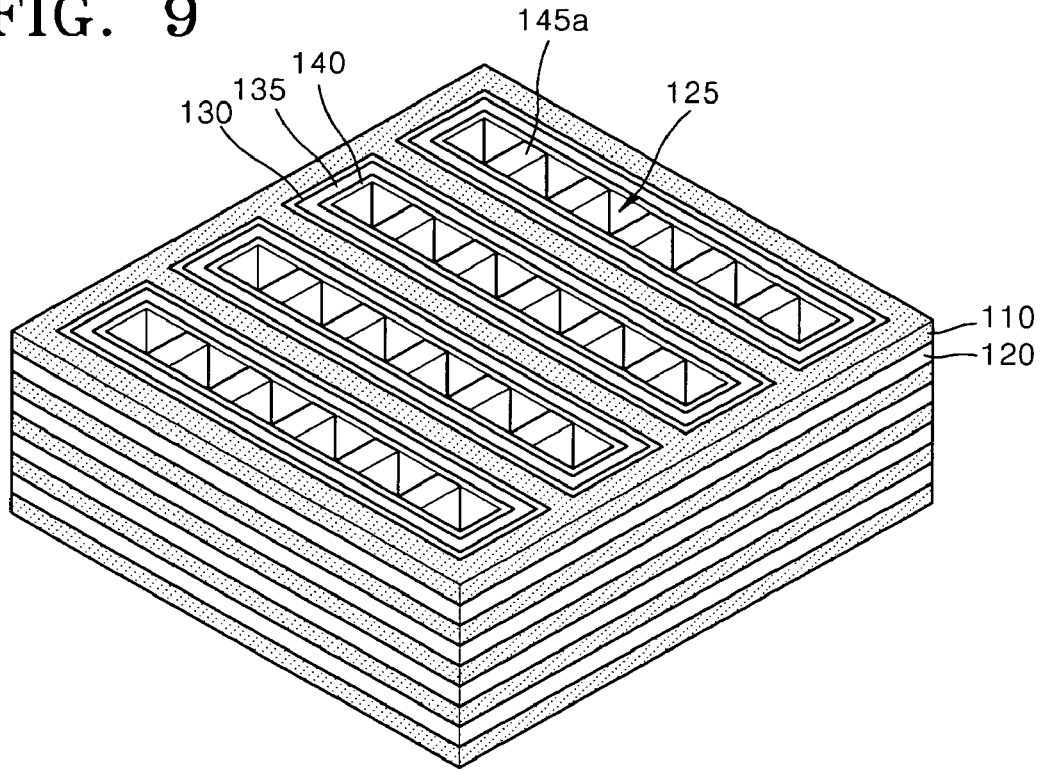

Referring to FIG. 9, the semiconductor layers 145 in FIG. 8 may be patterned to form at least one, for example, a plurality of semiconductor columns 145a that are defined within the trenches 125. As a result, the semiconductor columns 145a may be vertically arranged across the conductive layers 110. The patterning process may be performed using photolithography and etching. The width and length of the semiconductor columns 145a may be appropriately varied according to the memory capacity of the non-volatile memory device.

Figure 10:
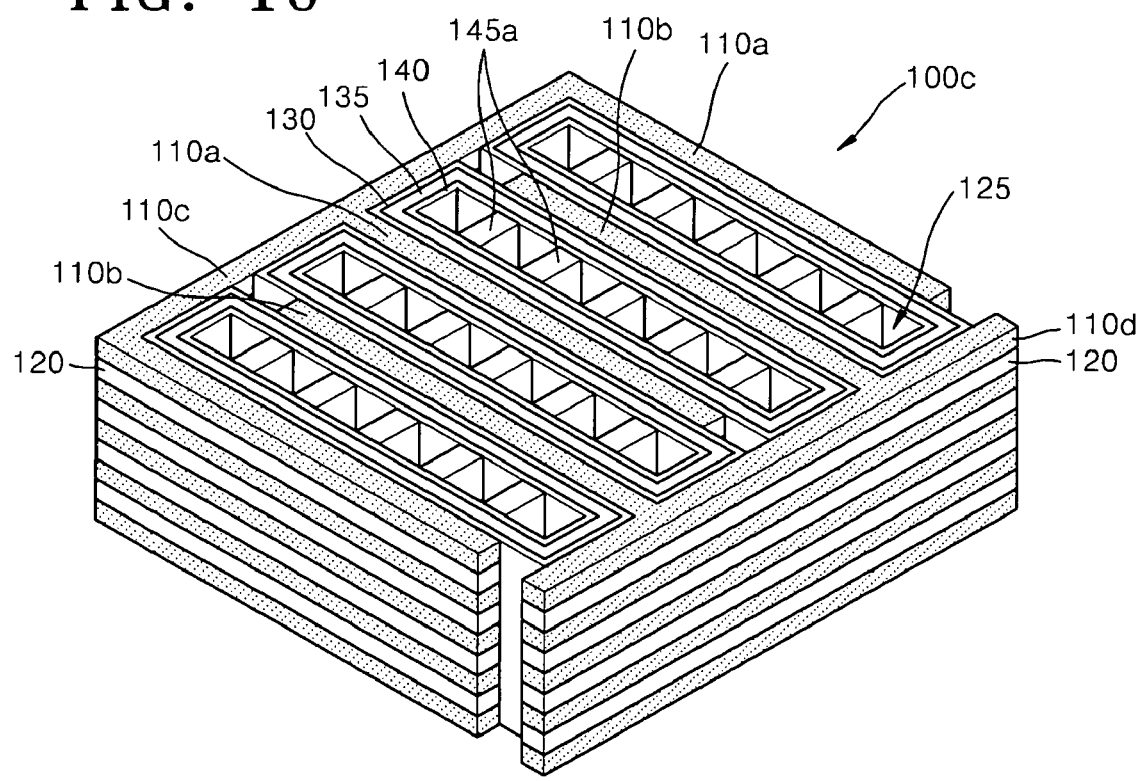

Referring to FIG. 10, the first and second control gate electrodes 110a and 110b and the first and second word lines 110c and 110d may be formed by patterning the conductive layers 110 and the interlayer insulating layers 120 in FIG. 9. For example, parts of the opposing conductive layers 110 remaining on both ends of the trenches 125 may be defined as the first and second word lines 110c and 110d, and parts of the conductive layers 110 remaining on the opposing sides of the trenches 125, some of which are between the trenches 125, may be defined as the first and second control gate electrodes 110a and 110b. This patterning may be performed such that the first control gate electrodes 110a and the second word lines 110d may be separated from one another and the second control gate electrodes 110b may be separated from the first word lines 110c. According to the method described above, a stacked structure of memory cells may be simultaneously formed. In other words, the above-described method simplifies the processes, thus reducing the manufacturing cost.

Figure 11:
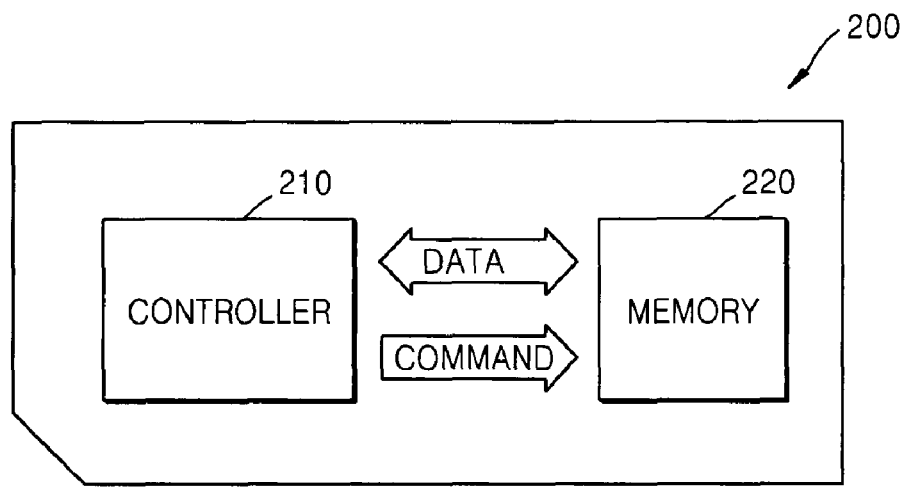

FIG. 11 is a block diagram of a card 200 according to example embodiments. Referring to FIG. 11, a controller 210 and a memory 220 may be arranged so that the controller 210 and the memory 220 may exchange electrical signals. For example, when the controller 210 issues a command, the memory 220 may transfer data. In example embodiments, the controller 210 may control a data bit scheme of the memory 220. The memory 220 may include at least one of the non-volatile memory devices 100a, 100b, and 100c of FIGS. 1 through 3. The card 220 may be used in a memory device, e.g., a multi-media card (MMC) or a secure digital (SD) card.

Figure 12:
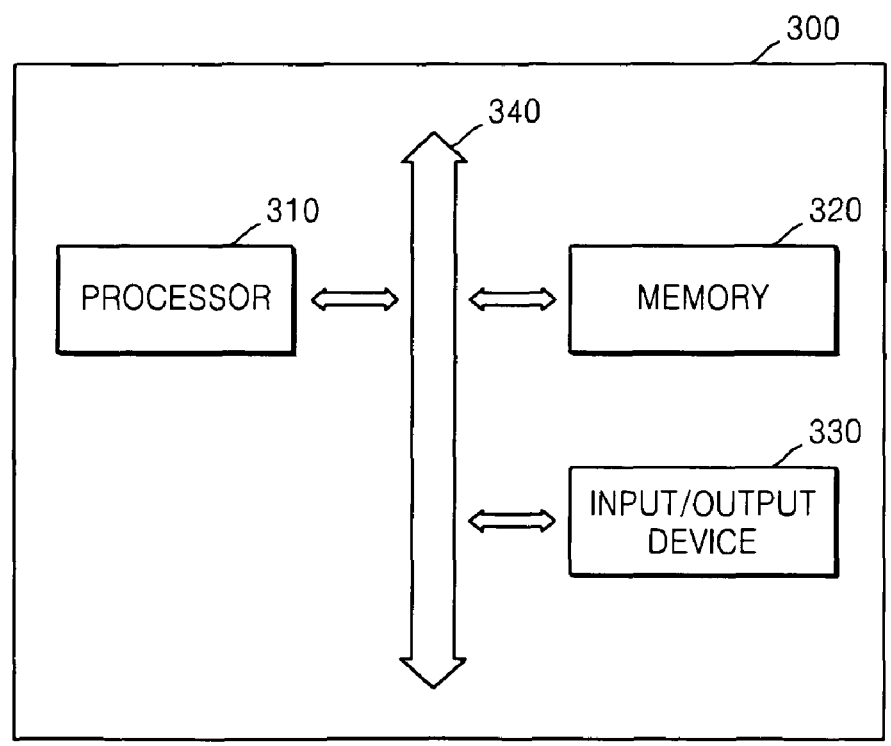

FIG. 12 is a block diagram of a system 300 according to example embodiments. Referring to FIG. 12, a processor 310, an input/output device 330 and a memory 320 may perform data communications using a bus 340. The processor 310 may execute a program and control the system 300. The input/output device 330 may be used to input or output data of the system 300. The system 300 may exchange data with an external device, for example, a personal computer (PC) or a network, using the input/output device 300 by being connected to the external device.

The memory 320 may include at least one of the non-volatile memory devices 100a, 100b, 100c and 100d of FIGS. 1 through 4. For example, the memory 320 may store a code and data for the operation of the processor 310. For example, this system 300 may be used in a mobile device, for example, a mobile phone, a MP3 player, a navigation device, or a solid state disk (SSD), or in other household appliances.

A non-volatile memory device according to example embodiments may more easily expand to a stacked structure. The non-volatile memory device according to example embodiments may be highly integrated by increasing the number of stacks of memory cells. Thus, the non-volatile memory device according to example embodiments may be suitable for high-capacity products. In addition, according to a method of fabricating a non-volatile memory device according to example embodiments, a stacked structure of memory cells may be simultaneously formed. Thus, the non-volatile memory device having a stacked structure may be fabricated through simplified processes, thus reducing the manufacturing cost.

While example embodiments have been particularly shown and described with reference to example embodiments thereof, it will be understood by those of ordinary skill in the art that various changes in form and details may be made therein without departing from the spirit and scope of the appended claims. Example embodiments should be considered in a descriptive sense only and not for purposes of limitation. Therefore, the scope is defined not by the detailed description of example embodiments but by the appended claims, and all differences within the scope will be construed as being included in example embodiments.

What is claimed is:

1. A non-volatile memory device comprising:
    at least one semiconductor column;
    at least one first control gate electrode arranged on a first side of the at least one semiconductor column;
    at least one second control gate electrode arranged on a second side of the at least one semiconductor column;
    a first charge storage layer between the at least one first control gate electrode and the at least one semiconductor column; and
    a second charge storage layer between the at least one second control gate electrode and the at least one semiconductor column.

2. The non-volatile memory device of claim 1, wherein the at least one first control gate electrode and the at least second control gate electrode are arranged to face each other with the at least one semiconductor column therebetween.

3. The non-volatile memory device of claim 1, further comprising:
    a first tunneling insulating layer between the at least one semiconductor column and the first charge storage layer; and
    a first blocking insulating layer between the first charge storage layer and the at least one first control gate electrode.

4. The non-volatile memory device of claim 1, further comprising:
    a second tunneling insulating layer between the at least one semiconductor column and the second charge storage layer; and
    a second blocking insulating layer between the second charge storage layer and the at least one second control gate electrode.

5. The non-volatile memory device of claim 1, wherein the at least one semiconductor column is vertically extended on a substrate.

6. The non-volatile memory device of claim 5, wherein the at least one first control gate electrode includes a plurality of first control gate electrodes stacked on the at least one semiconductor column, and
    the at least one second control gate electrode includes a plurality of second control gate electrodes stacked on the at least one semiconductor column.

7. The non-volatile memory device of claim 6, wherein the first charge storage layer is a charge trapping type and extends across the plurality of first control gate electrodes and on the at least one semiconductor column.

8. The non-volatile memory device of claim 6, wherein the second charge storage layer is a charge trapping type and extends across the plurality of second control gate electrodes and on the at least one semiconductor column.

9. The non-volatile memory device of claim 6, further comprising:
    interlayer insulating layers between the plurality of first control gate electrodes and between the plurality of second control gate electrodes.

10. The non-volatile memory device of claim 1, wherein the at least one semiconductor column includes a plurality of semiconductor columns between the at least one first control gate electrode and the at least one second control gate electrode.

11. The non-volatile memory device of claim 10, wherein the first charge storage layer extends across a first side of the plurality of semiconductor columns, and the second charge storage layer extends across a second side of the plurality of semiconductor columns.

12. The non-volatile memory device of claim 11, wherein the first charge storage layer and the second charge storage layer are connected to each other and are of a charge trapping type.

13. The non-volatile memory device of claim 1, wherein the at least one semiconductor column includes a plurality of semiconductor columns,
    the at least one first control gate electrode includes a plurality of first control gate electrodes stacked along a first side of the plurality of semiconductor columns, and
    the at least one second control gate electrode includes a plurality of second control gate electrodes stacked along a second side of the plurality of semiconductor columns.

14. The non-volatile memory device of claim 13, further comprising:
    a plurality of first word lines stacked as multiple layers to be connected to the plurality of first control gate electrodes; and a plurality of second word lines stacked as multiple layers to be connected to the plurality of second control gate electrodes.

15. The non-volatile memory device of claim 14, wherein the plurality of first word lines and the plurality of second word lines are arranged on opposing sides of the non-volatile memory device, separate from each other, with the plurality of semiconductor columns therebetween.

16. The non-volatile memory device of claim 13, wherein the plurality of semiconductor columns are arranged as a matrix, and the first charge storage layer and the second charge storage layer form a single charge storage layer by being connected to each other and surrounding semiconductor columns arranged in each column of the matrix.

17. A method of fabricating a non-volatile memory device, the method comprising:
providing at least one conductive layer;
forming at least one trench in the at least one conductive layer;
forming a charge storage layer on an inner surface of the at least one trench;
forming at least one semiconductor column in the at least one trench on which the charge storage layer is formed; and
patterning the at least one conductive layer to form at least one first control gate electrode and at least one second control gate electrode separate from one another with the at least one semiconductor column therebetween.

18. The method of claim 17, wherein forming the at least one semiconductor column includes:
forming a semiconductor layer on the charge storage layer to fill the at least one trench; and
patterning the semiconductor layer to form a plurality of semiconductor columns separate from one another in the at least one trench.

19. The method of claim 17, further comprising:
forming a blocking insulating layer on an inner surface of the at least one trench before forming the charge storage layer; and
forming a tunneling insulating layer on the charge storage layer after forming the charge storage layer.

20. The method of claim 17, wherein the at least one conductive layer includes a plurality of conductive layers stacked upon one another.

21. The method of claim 20, wherein the at least one first control gate electrode includes a plurality of first control gate electrodes that are formed of portions of the plurality of conductive layers and are stacked along a first side of the at least one semiconductor column, and
the at least one second control gate electrode includes a plurality of second control gate electrodes that are formed of portions of the plurality of conductive layers and are stacked along a second side of the at least one semiconductor column.

22. The method of claim 20, wherein the at least one trench includes a plurality of trenches in the plurality of conductive layers.

23. The method of claim 22, wherein the at least one semiconductor column includes a plurality of semiconductor columns in the plurality of trenches.

24. The method of claim 22, wherein the at least one first control gate electrode includes a plurality of first control gate electrodes that are formed of portions of the plurality of conductive layers and are stacked along a first side of the plurality of semiconductor columns, and
the at least one second control gate electrode includes a plurality of second control gate electrodes that are formed of portions of the plurality of conductive layers and are stacked along a second side of the plurality of semiconductor columns.

25. The method of claim 24, further comprising:
forming a plurality of first word lines defined as portions of the plurality of conductive layers and stacked as multiple layers to be connected to the plurality of first control gate electrodes; and
forming a plurality of second word lines defined as portions of the plurality of conductive layers and stacked as multiple layers to be connected to the plurality of second control gate electrodes.

* * * * *